United States Patent
Peel et al.

(10) Patent No.: US 6,894,935 B2
(45) Date of Patent: May 17, 2005

(54) MEMORY DATA INTERFACE

(75) Inventors: Eric Peel, Costa Mesa, CA (US); Qing Xue, Costa Mesa, CA (US); Sam Su, Costa Mesa, CA (US); Stephen Eugene Holness, Costa Mesa, CA (US)

(73) Assignee: Emulex Design & Manufacturing Corporation, Costa Mesa, CA (US)

( * ) Notice: Subject to any disclaimer, the term of this patent is extended or adjusted under 35 U.S.C. 154(b) by 64 days.

(21) Appl. No.: 10/440,855

(22) Filed: May 19, 2003

(65) Prior Publication Data

US 2004/0233733 A1 Nov. 25, 2004

(51) Int. Cl.$^7$ ............................................... G11C 16/04
(52) U.S. Cl. ............................ 365/189.12; 365/189.07; 365/230.09
(58) Field of Search ..................... 365/63, 189.02, 365/189.08, 189.12, 189.07, 239, 194, 230.02, 230.09

(56) References Cited

U.S. PATENT DOCUMENTS 5,590,134 A * 12/1996 Yin ............................ 714/722
6,237,052 B1 * 5/2001 Stolowitz ..................... 710/61
6,333,889 B1 * 12/2001 Arimoto ................. 365/230.03

* cited by examiner

Primary Examiner—Anh Phung
Assistant Examiner—Hien Nguyen
(74) Attorney, Agent, or Firm—Morrison & Foerster LLP

(57) ABSTRACT

The present invention is directed to a memory data interface for transferring data between a memory device and an integrated circuit, whereby, in accordance with one aspect of the present invention, the memory data interface includes a data selector for selecting and normalizing data from memory devices operating at different data transfer timing, and, in accordance with another aspect of the present invention, the memory data interface is capable of transferring data between a memory device and an integrated circuit having a different bus width than the memory device. In accordance with yet another aspect of the present invention, the memory data interface is capable of transferring data between an integrated circuit and a variety of different memory device having different data bus widths. Finally, in accordance with yet another aspect of the present invention, the memory data interface is capable of transferring data between an integrated circuit and a variety of memory devices having different bus widths and different data transfer timing.

32 Claims, 10 Drawing Sheets

72-BIT INTERNAL DATA BUS TO 36-BIT QDR BUS

72-BIT INTERNAL DATA BUS TO 18-BIT QDR BUS

MEMORY DATA INTERFACE

BACKGROUND OF THE INVENTION

1. Field of Invention

The present invention is directed to an external memory interface that enables devices such as application specific integrated circuit ("ASIC") devices to read and write data to and from different memory devices having different configurations.

2. Description of Related Art

Certain memory devices, such as quad data rate synchronous random access memory devices, ("QDR SRAMs"), are high-speed memory devices that are capable of, inter alia, supporting balanced read and write cycles to thereby transfer data at a higher frequency than conventional memory devices. Currently, QDR memory devices are available in several different varieties, such as QDR-I (first-generation) and QDR-II (second-generation) that have different configurations such as different data transfer frequencies and data valid windows. In addition, different bus-widths are available for QDR devices, such as 8-bit, 16-bit and 32-bit bus widths.

Due to the various different QDR devices available, there is a need to provide support for transferring data between the many different varieties of QDR devices and a given ASIC device. This will allow products that incorporate ASIC devices to interface with either "wide" memory devices having wide data bus configuration for high performance applications, or "narrow" memory devices with narrower bus widths at a lower cost. For instance, with specific regard to QDR memory devices, QDR-I devices can be used if they are more cost-effective and readily available than QDR-II devices, or vice versa. By supporting both devices, using QDR-I devices that are plentiful now but may be phased out of manufacture later will not make the ASIC device obsolete, since QDR-II devices can be used instead.

Supporting data transfer between the different incarnations of memory devices and an ASIC device can complicate the design of a memory interface in more than one way. For instance, QDR-II devices output read data at a later time than QDR-I devices do, so an interface that supports both QDR-I and QDR-II devices must be able to distinguish the different types of data and accommodate the timing difference. Additionally, in order to accommodate different memory devices having different data bus configurations, some of which do not match the bus configurations of the coupled ASIC, an interface between the memory device and an ASIC device (or an interface section built into the ASIC device) must be able to accurately transfer data between the memory device and the ASIC device without losing any of the data in the process.

SUMMARY OF THE INVENTION

It is an object of the present invention to provide a memory data interface that facilitates an ASIC device to write data to, and read data from, different types of memory devices, such as different types of QDR memory devices that have different data read/write rate and different data bus configurations. The present invention provides the advantage of allowing an ASIC device to be used on products aimed at different markets, e.g. high-performance or low-cost. The ability of the present invention to support both QDR-I and QDR-II devices and/or memory devices of different bus widths such as 16-bit and 32-bit, provides an engineer added flexibility to select external memory devices for an ASIC device and allows the ASIC device to be used over the lifetime of more than one generation of memory products (at the time of the filing of the present application, it is expected that QDR-I device will be phased out of manufacture while QDR-II devices will be phased into manufacture), thereby allowing engineers to select and use memory parts that best meet the requirements of availability and cost-effectiveness at a given period of time. More specifically, the present invention provides the ability to use a single ASIC device for both high-performance applications and low-cost applications, without the need to create two or more different versions of an ASIC to target these markets.

In accordance with a preferred embodiment of the present invention, a flexible external memory interface is provided whereby the interface can capture read data from either QDR-I or QDR-II devices by effecting a predetermined amount of time delay into the read data from the QDR-I data path. The delay inserted preferably models the difference in delay expected based on comparison of the configuration of both devices under a specific operational environment. To interface properly to different devices, knowledge of which type of QDR device being coupled to the ASIC should be first communicated to the circuit so that the interface selects and outputs data from the correct data path.

It is another object of the present invention to provide support for different QDR memory devices having different bus widths, such as supporting QDR devices having 16- or 32-bit bus width configurations; in doing so, care must be made to route all data to the proper byte lanes when writing to or reading from devices of either width without losing any data or overwriting the wrong memory locations.

In accordance with a second preferred embodiment of the present invention, a flexible bus width memory interface is provided whereby multiplexers and registers are adaptable to write data to and read data from any one of various different memory devices having different bus configurations, without the need to change the hardware components. More specifically, in accordance with one preferred embodiment, for data transfer from the internal data bus of an ASIC device to a memory device having a narrower data bus, multiplexer configuration is used to transfer the data in multiple stages. Vice versa, to transfer data from a QDR device to an ASIC having a wider internal bus, data is transferred via a cascade of registers in multiples stages. Additionally, the multiplexer and the register configurations are changeable to support data transfer from different types of memory devices to the ASIC.

Finally, it is also an object of the present invention to provide support for both QDR-I and QDR-II memory devices as well as different memory devices having different bus widths. Hence, the first and second preferred embodiments can be combined to form a flexible memory interface in accordance with a third preferred embodiment of the present invention.

DETAILED DESCRIPTION OF THE PREFERRED EMBODIMENTS

The preferred embodiment of the present invention with now be described with references to FIGS. 1–17, which are shown by way of illustrating specific embodiments in which the present invention may be practiced. It should be understood by one ordinary skilled in the art that other embodiments may be used and structural alterations may be made without departing from the scope of the preferred embodiment of the present invention.

The preferred embodiments of the present invention provide a flexible external memory interface that, in one aspect, normalizes the data read/write timing difference between QDR I and QDR II memory devices, and, in another aspect, accommodate read/write operations between an ASIC device and various types of memory devices having different data bus configurations, whereby the data bus configurations may be narrower than the internal bus configuration of the ASIC device.

While several configuration differences exist between QDR-I and QDR-II devices, one significant difference is the fact that QDR-II devices emit read data at a later time than QDR-I devices. While data are output near a clock edge in QDR-II devices, QDR-I devices emit read data at a fixed amount of time after a (different) clock edge. The absolute difference in time between QDR-I and QDR-II read data outputs will depend on the speed grade of devices used, and one skilled in the art should be able to readily determine the difference by referencing the specification data for the devices. Once a timing difference is determined, support for both QDR-I and QDR-II devices requires circuitry that separates the read data inside the ASIC into two paths. One path will provide read data directly into registers or latches with little delay. QDR-I data, instead, must be delayed and therefore the use of delay elements will be necessary before the data are registered into ASIC flip-flops. After this point, the data from both the QDR-I device and from the QDR-II device can be treated equally (data are normalized).

Figure 1:
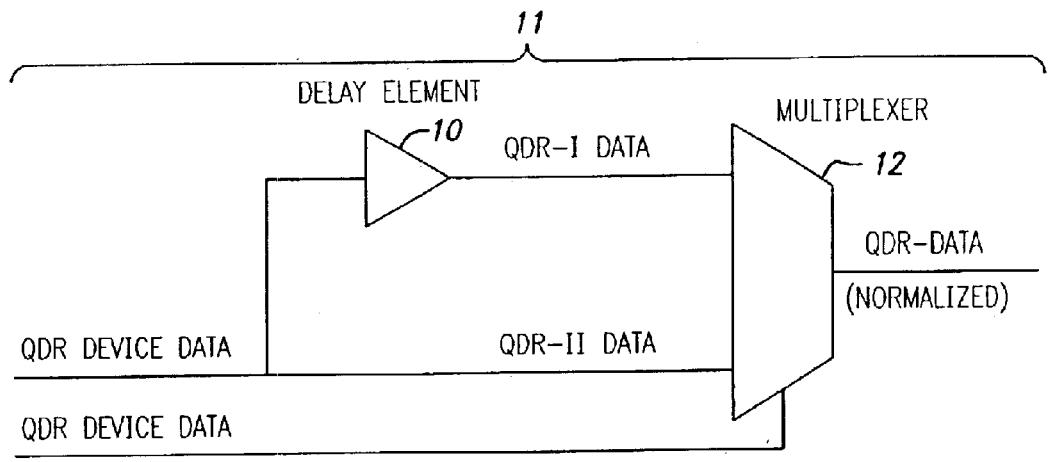
FIG. 1 is an exemplary block diagram illustrating a circuit configuration for compensating the data transfer rate difference between a QDR I and QDR II device in accordance with a preferred embodiment of the present invention.

FIG. 1 shows an exemplary block diagram of a circuit component in accordance with a preferred embodiment of the present invention whereby data from a QDR I memory device is normalized with data from a QDR II memory device by delaying the QDR I data via a delay element 10. The two types of data—QDR II data and delayed QDR I data—are then selected via a multiplexer 12, to which a QDR mode select pin is configured.

Figure 2:
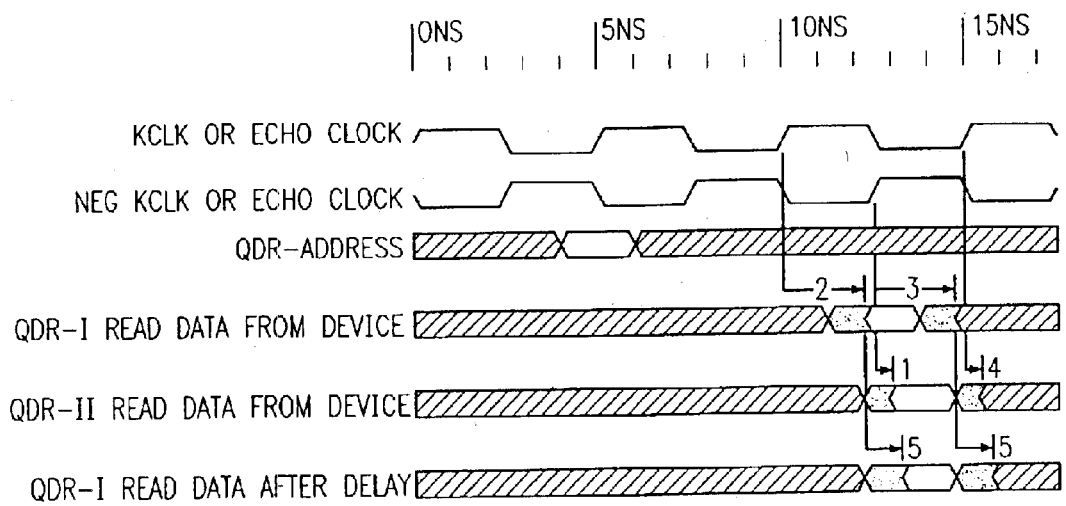
FIG. 2 is an exemplary timing diagram illustrating data reading sequence for reading data from sources of QDR I, QDR II, and data delayed from QDR I in accordance with a preferred embodiment of the present invention.

FIG. 2 shows a timing diagram illustrating the difference in read data timing for a representative example of QDR-I and QDR-II timing (using 200 MHz device data). As illustrated in FIG. 2, QDR-II read data and delayed QDR-I read data occur at substantially the same point in time, which is the desired effect as a result of the normalization process shown in FIG. 1. In this illustration, the delay incurred in the QDR-I data path is 1.0 nanosecond. The following provides additional information regarding the timing diagram of FIG. 2:

QDR-II read data from device valid between −0.35 ns & 0.35 ns from edge;

QDR-I read data from device valid between 1.2 ns & 2.2 ns from edge;

QDR-I read data from device invalid between 1.2 ns & 2.2 ns from edge;

QDR-II read data from device invalid between −0.35 ns & 0.35 ns from edge;

QDR-I read data delayed 1.0 ns after read data from device

In another aspect of a preferred embodiment, the present invention provides a configurable interface for transferring data between an ASIC device and a memory device, such as QDR memory devices, having different bus width than the ASIC device. In accordance with the preferred embodiment, the ASIC device preferably includes enough input pins and output pins to support the widest QDR memory device anticipated to be used. In the case of smaller-bus-width devices, some ASIC pins can be idle. The specific objective is to match the internal data bus bandwidth with the data bus bandwidth of the memory device.

To illustrate, assuming in one application of the present invention that the internal data bus width of an ASIC device is 64 bits, and the coupled QDR memory device has a bus width of 32. If the internal data bus is using the same clock speed that the QDR interface is, the bandwidth of the internal data bus will match that of the QDR data bus, since the QDR data bus uses two clocks to time data instead of one. In other words, a 200-MHz internal bus of 64 bits and a 200-MHz external QDR bus of 32 bits are a perfect bandwidth match, because the QDR data bus effectively switches at a rate of 400-MHz. In order to match the bandwidth of a 16-bit QDR data bus, however, the external bandwidth is halved. In this case, the internal data bus must be intentionally "slowed down" by a method such as accepting or providing data on every other clock, by changing the internal clock speed, or by forcing a narrower data bus internally as well.

In an effort to match the bandwidth between the ASIC device and the external memory device, data must be routed to the correct byte lanes. Obviously, if the external device has a bus width of 16 bits and the internal bus width is 64 bits, the data will need to be temporarily stored and emitted when it is to be written. If the external device's bus width is instead 32 bits, it will need data to be multiplexed differently. Accordingly, in the event that data is read from the QDR device having a data bus of 16 bits, it will need to be captured and routed differently than if the data bus were 32 bits wide.

Furthermore, some application may include transferring of parity bits, which is normally a single bit of parity that accompanies each 8 bits of data. Finally, in case not all bits of all data words are to be written on every clock cycle, memory devices can accept byte write enable input signals. Asserting a byte write enable together with its corresponding byte of data and optional bit of parity results in a completed write operation of that particular byte. These byte write enables are preferably valid upon the data switches that are every half-clock-cycle. Accordingly, the byte write enables go through similar paths as the data and parity bits do.

FIGS. 3–8 show exemplary applications of the preferred embodiment and how multiplexing can be accomplished for the applications described above, whereby an ASIC device having an internal data bus width of 64 bits is operatively coupled to an external memory device having a data bus width of either 16 or 32 bits. First, we'll look at how 64 internal bits are reduced down to 16 external bits for writing to the device, in a series of four steps. Then we will see how the same hardware can be used in the situation where the external bus is 32 bits wide.

FIGS. 3–6 illustrate a partial section of an external memory interface in accordance with a preferred embodiment of the present invention. More specifically, a write data section 30 includes a pair of multiplexers 31 and 32 for writing data from an ASIC device having a 64-bit internal bus to a 16-bit QDR memory device. In this particular embodiment, data on half of the internal data bus is temporarily saved since, due to the bus mismatch, the data may be lost without having been written to the QDR device if it is not saved. For purposes of this application, saved data from the ASIC internal data bus will be referred to as "write_data_saved." The data from the portion of the internal data bus that is not "saved" will be called "write_data". In accordance with the preferred embodiment, the higher-order bits of the internal data bus are preferably written to the QDR device first, and the lower-order bits will be written last.

Figure 3:
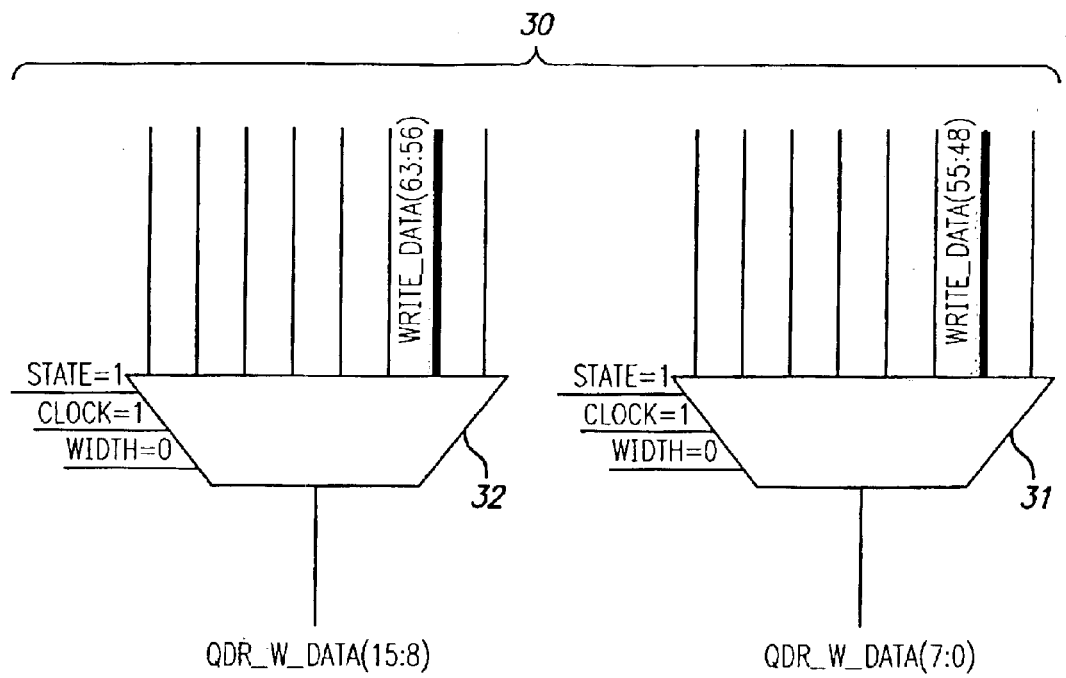
FIG. 3 is an exemplary block diagram illustrating writing data from a 64-bit internal bus to a 16-bit external memory bus in accordance with a preferred embodiment of the present invention.

FIG. 3 illustrates the first step of a writing process at which the clock state is shown as 0, and the width is set at 0, indicating the bus width of the external memory device is 16 bits. In FIG. 3, internal data bus data bits 63 to 56 are selected to be written to the QDR device as bits 15 to 8. Similarly, the internal data bus data bits 55 to 48 are written to the QDR device as bits 7 to 0. Again, note that this happens when clock=1, state=1, and width=0. In this particular embodiment, width is defined to be 0 to signify a 16-bit QDR device in this example, and 1 to signify a 32-bit device.

Figure 4:
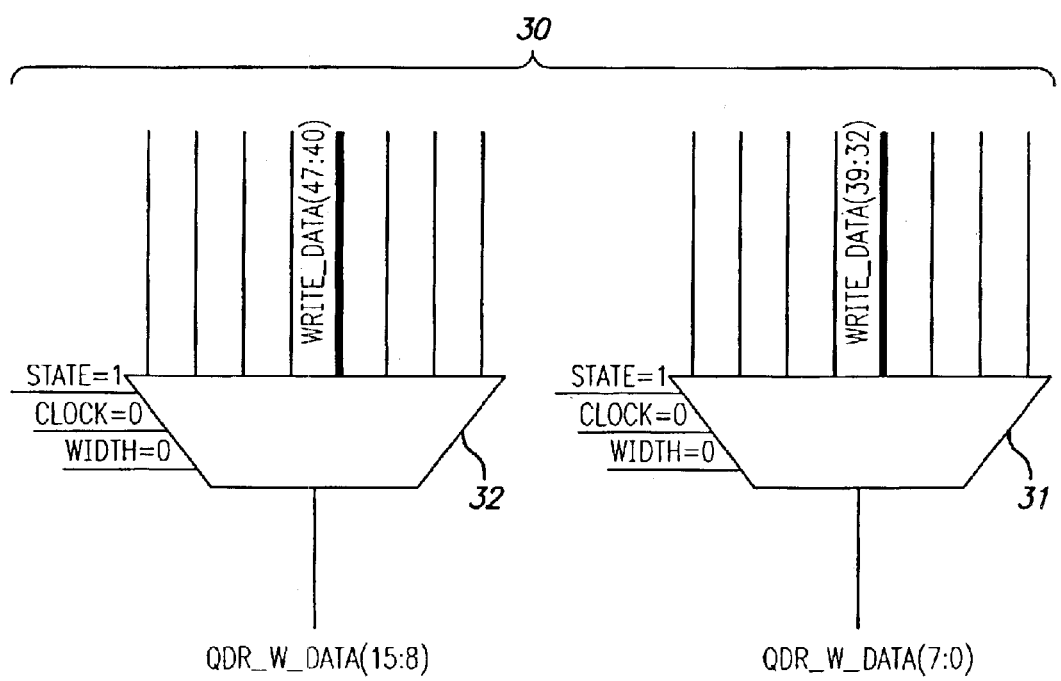
FIG. 4 is another exemplary block diagram illustrating writing data from a 64-bit internal bus to a 16-bit external memory bus in accordance with a preferred embodiment of the present invention.
Figure 5:
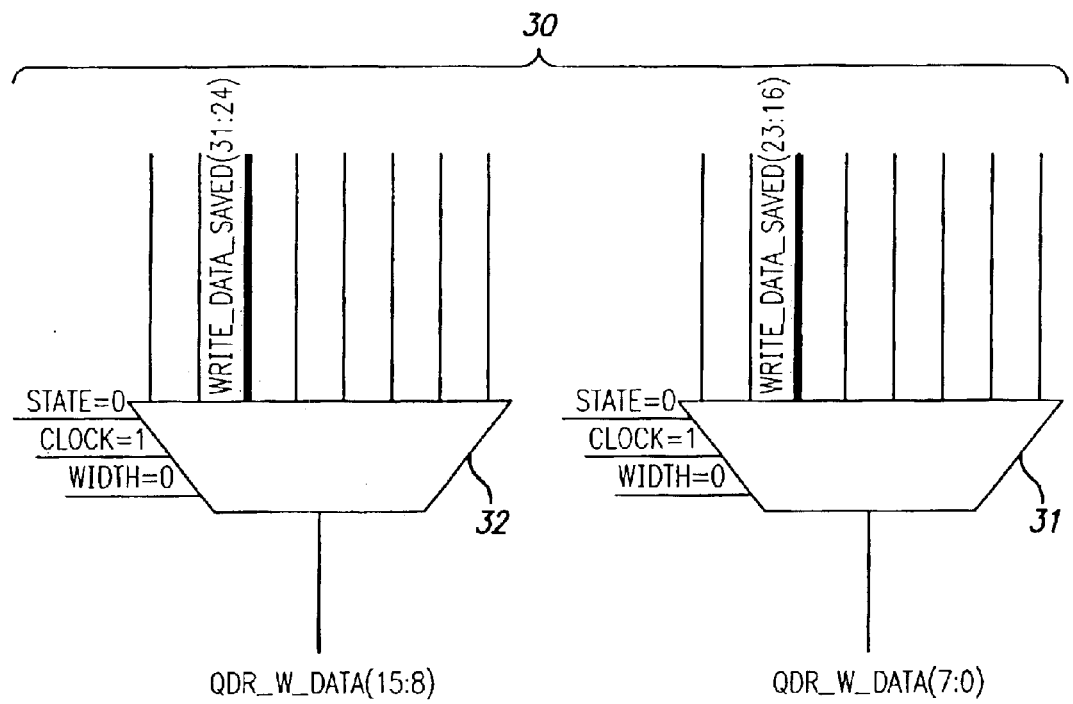
FIG. 5 is yet another exemplary block diagram illustrating writing data from a 64-bit internal bus to a 16-bit external memory bus in accordance with a preferred embodiment of the present invention.
Figure 6:
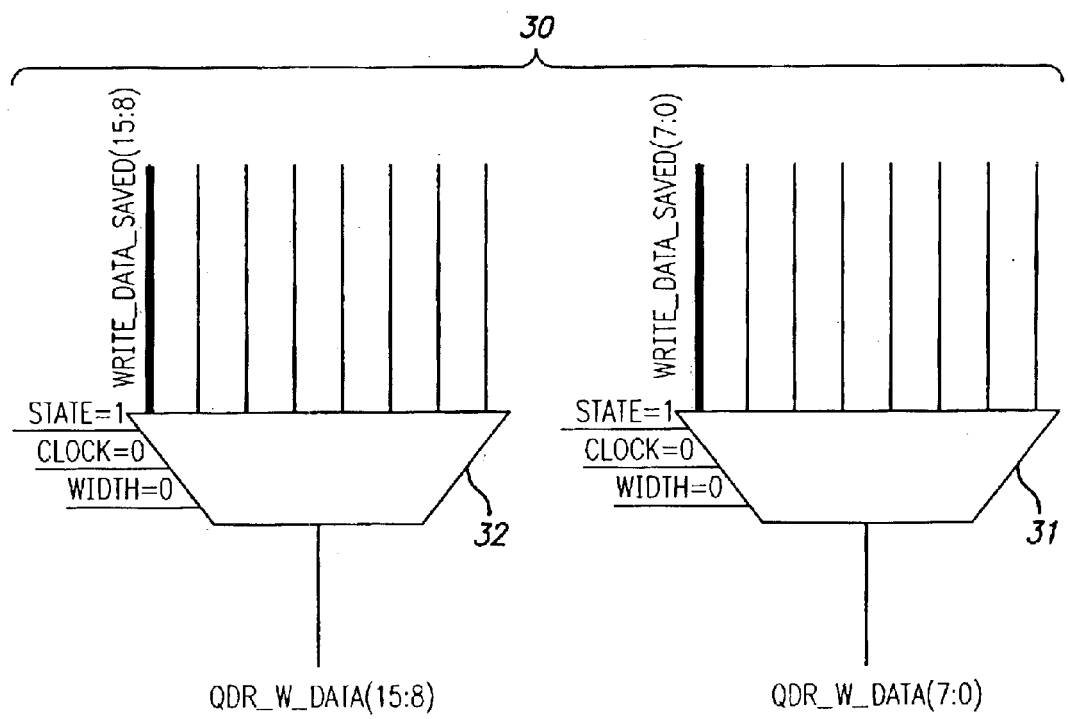
FIG. 6 is yet another exemplary block diagram illustrating writing data from a 64-bit internal bus to a 16-bit external memory bus in accordance with a preferred embodiment of the present invention.

FIG. 4 shows that, at clock state=0, internal bus bits 47 to 40 are written to the QDR device as bits 15 to 8 and bits 39 to 32 of the internal data bus are selected to be written as bits 7 to 0 of the QDR device. In FIG. 5, internal bus bits 31 to 24 are assumed to have been saved as "write_data_saved" and are selected to be written to the QDR device as bits 15 to 8. In a similar manner, bits 23 to 16 have also been saved and are written to the QDR device as bits 7 to 0 on that device. The use of saved data bus bits will be needed if the internal data bus does not "hold" its data for an extra clock cycle while the QDR device is being written. One ordinarily skilled in the art should be able to effect a variety of manner by which data may be temporarily saved, all of which are considered to be within the scope of the present invention.

In FIG. 5, saved internal data bus data bits 15 to 8 are written to the QDR device as data bits 15 to 8. Also, data bits 7 to 0 of the saved data bus are written to the QDR device as data bits 7 to 0. This stage occurs when both state and clock are 0. In the above illustrated embodiment, all 64 bits of the internal data bus can be written to a 16-bit QDR device. These four stages can repeat as long as there are valid data being presented on the internal data bus.

Figure 7:
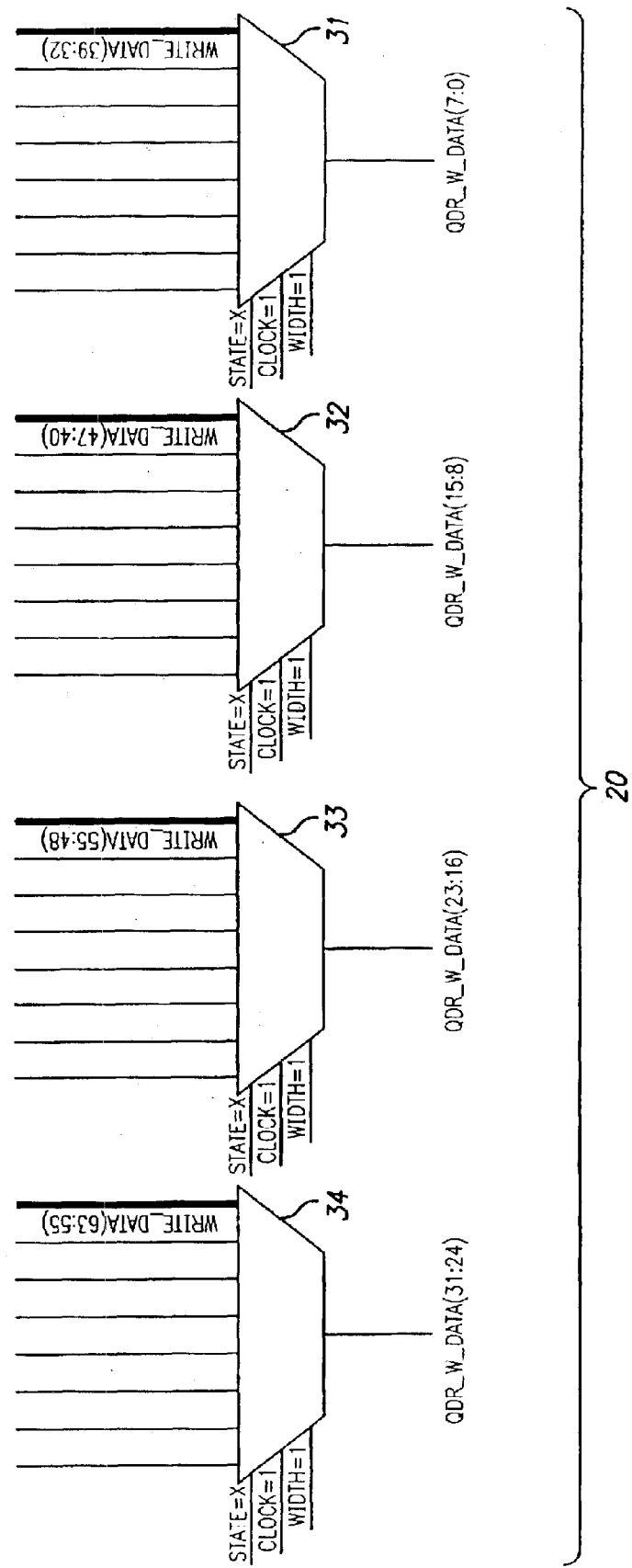
FIG. 7 is an exemplary block diagram illustrating writing data from a 64-bit internal bus to a 32-bit external memory bus in accordance with a preferred embodiment of the present invention.
Figure 8:
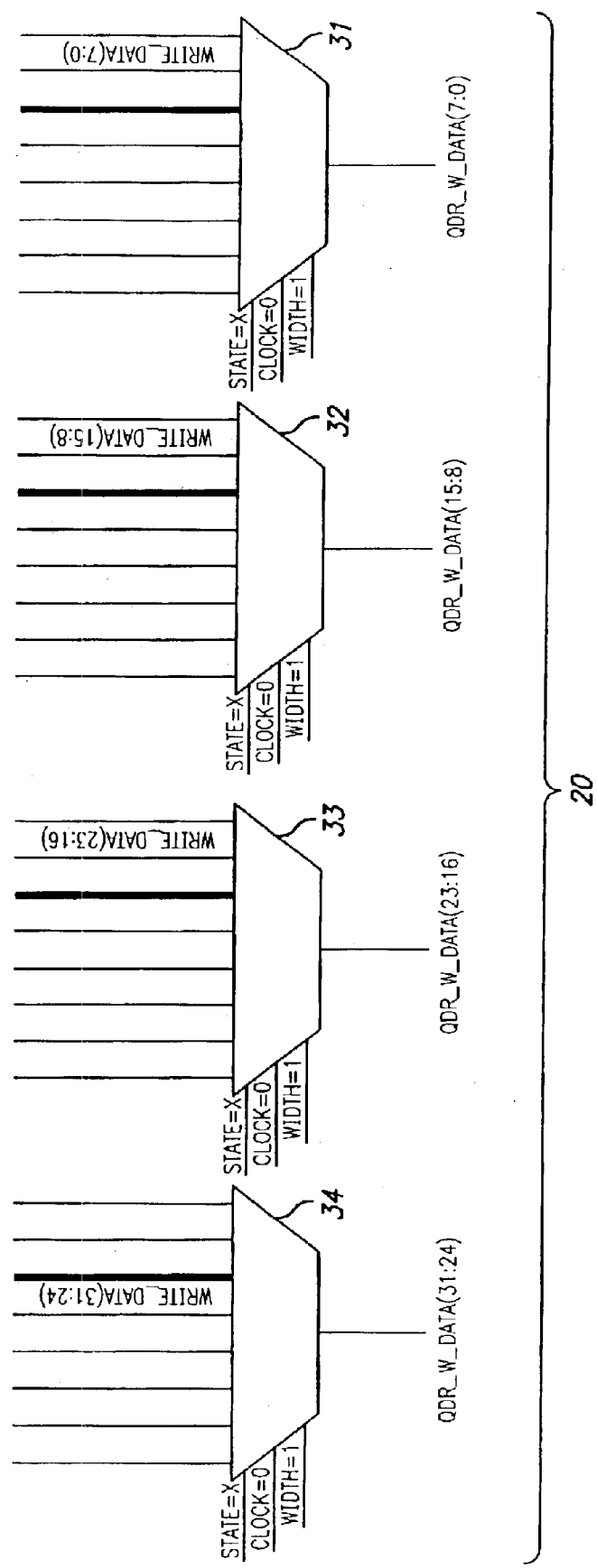
FIG. 8 is another exemplary block diagram illustrating writing data from a 64-bit internal bus to a 32-bit external memory bus in accordance with a preferred embodiment of the present invention.

FIGS. 7 and 8 illustrate an expanded write section 20 of the external memory interface in accordance with an alternative embodiment of the present invention. More specifically, write data section 20 includes four multiplexers 31–34 that are configured for writing data from an ASIC device having a 64-bit internal bus to a 32-bit QDR memory device. Note that in this particular configuration, the width bit is preset as 1.

In FIG. 7, with clock=1, the first half of the internal data bus is written to the QDR device, with data bits 63 to 32 being written to the QDR bus as data bits 31 to 0. Note again that width=1, meaning that this is a 32-bit QDR device that is being written to. The state value is irrelevant when a 32-bit QDR is attached, because this operation will happen in every state as long as data are valid.

In FIG. 8, with clock=0, the lower half of the internal data bus is written to the QDR device, with data bits 31 to 0 being written to the QDR bus as data bits 31 to 0. At this stage, the entire internal data bus has been written. These two stages can repeat as long as valid data are being presented on the internal data bus. It should be noted that the hardware configuration shown in FIGS. 7 and 8 can also be used to write data from a 64-bit ASIC device to a 16-bit memory device using only multiplexers 31 and 32 and by presetting the width control pin to be 0. It should also be noted that, as alternative embodiments to FIGS. 3–8, the number of multiplexers can be expanded or reduced, or different types of multiplexers can be used, to accommodate other ratios of data bus mismatch between an ASIC device and an coupled external memory device.

Figure 9:
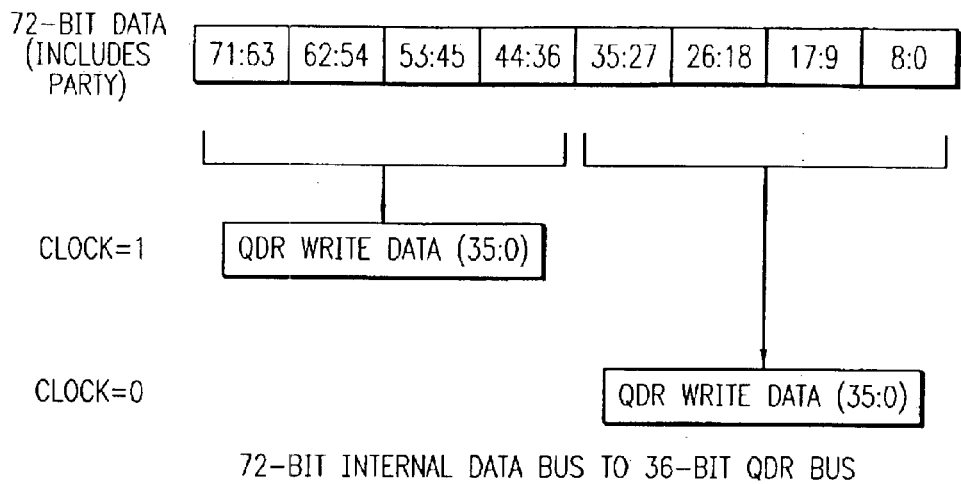
FIG. 9 is a schematic diagram illustrating writing data from a 72-bit internal data path to a 36-bit memory device in accordance with a preferred embodiment of the present invention.
Figure 10:
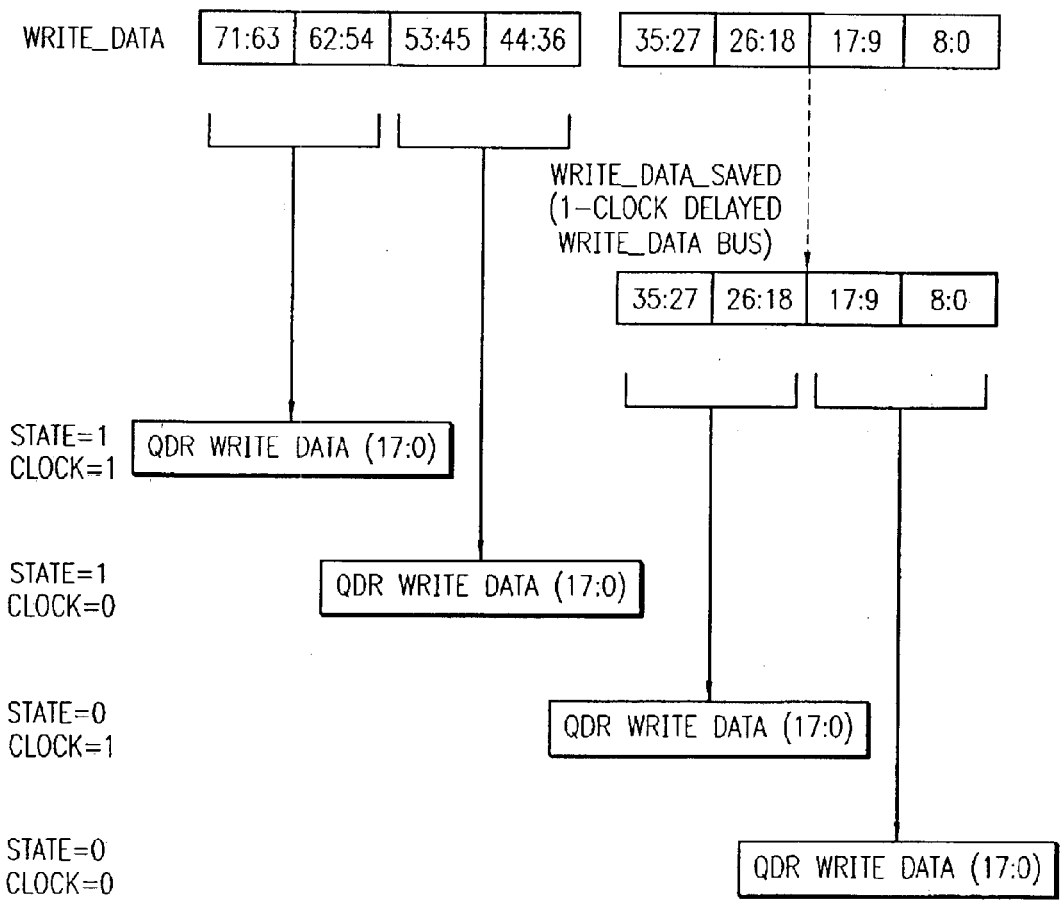
FIG. 10 is a schematic diagram illustrating writing data from a 72-bit internal data path to an 18-bit memory device in accordance with a preferred embodiment of the present invention.

FIGS. 9 and 10 illustrate a time sequence example of how a data word can be broken into pieces and reassembled into QDR write data words from a 72-bit internal data path (including parity) to both 36-bit and 18-bit QDR devices, respectively, in accordance with other embodiments of the present invention. Note that each parity bit is shown as part of the data bus. For example, the parity bit that accompanies data bits 0 through 7 is designated as bit 8. The next byte of data is called bits 9 through 16, while the parity bit for this data is bit 17, and so on. The hardware used for this operation are substantially similar to the ones illustrated in FIGS. 3–8, and one skilled in the art can modify the configurations shown in FIGS. 3–8 to realize the operational configurations of FIG. 9.

Method for handling the transfer of data from the external memory device to an ASIC device having a wider data bus configuration will now be discussed. As shown in the figures to be discussed below, data are preferably saved into registers in the process of building up the data width to match the width of the internal data bus.

FIGS. 11–14 show an exemplary block diagram of a data read section 80 of a memory interface in accordance with the preferred embodiment of the present invention. More specifically, FIGS. 11–14 show a cascade of registers 41–47 that accumulate and read data from a 16-bit memory device, such as a QDR memory device, to a 64-bit ASIC device.

Figure 11:
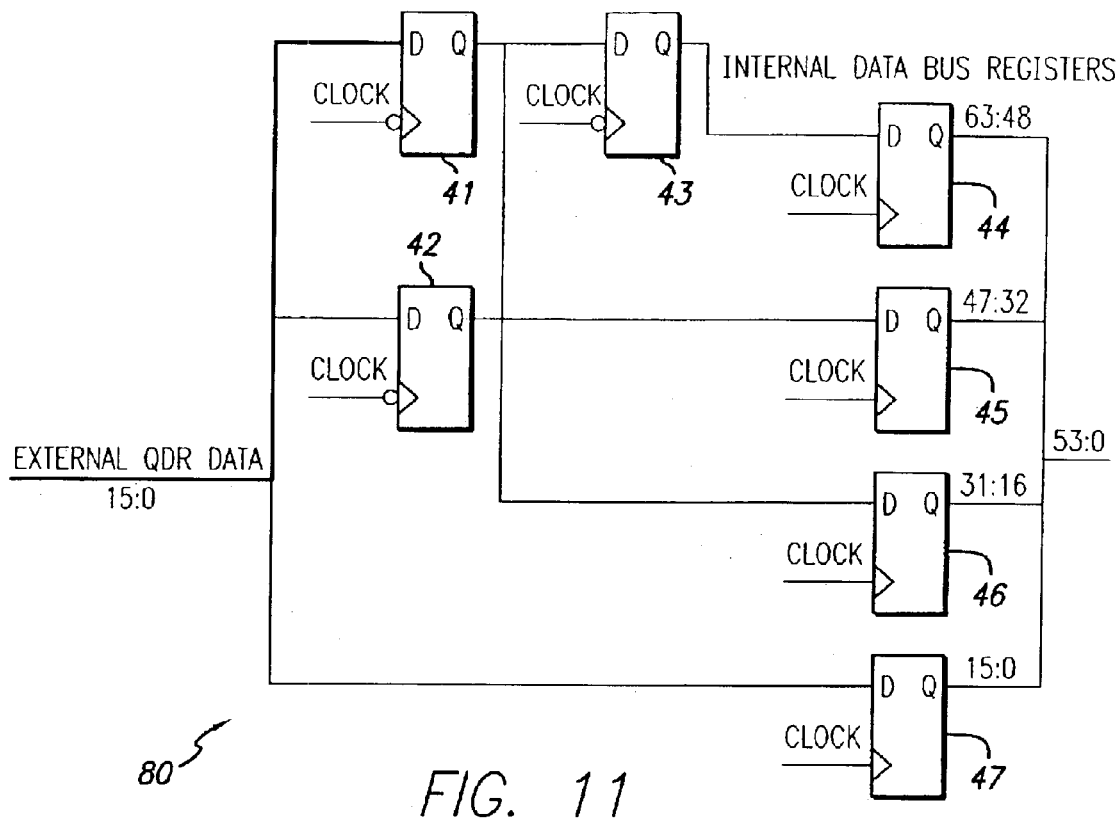
FIG. 11 is an exemplary block diagram illustrating writing data from a 16-bit memory device to a 64-bit internal data bus in accordance with a preferred embodiment of the present invention.

FIG. 11 illustrates the first of four stages for capturing and combining the 16-bit QDR data into a 64-bit internal data bus. As shown, at clock=0 (the bubble on the register clock inputs indicate that clock must equal 0 in order for that register to actively capture data on its D input pin). In FIG. 11, register 41 is capturing data from the external memory data bus, symbolically illustrated by the bold line leading to the D input pin. The register will save the data to be used at a later cycle.

Figure 12:
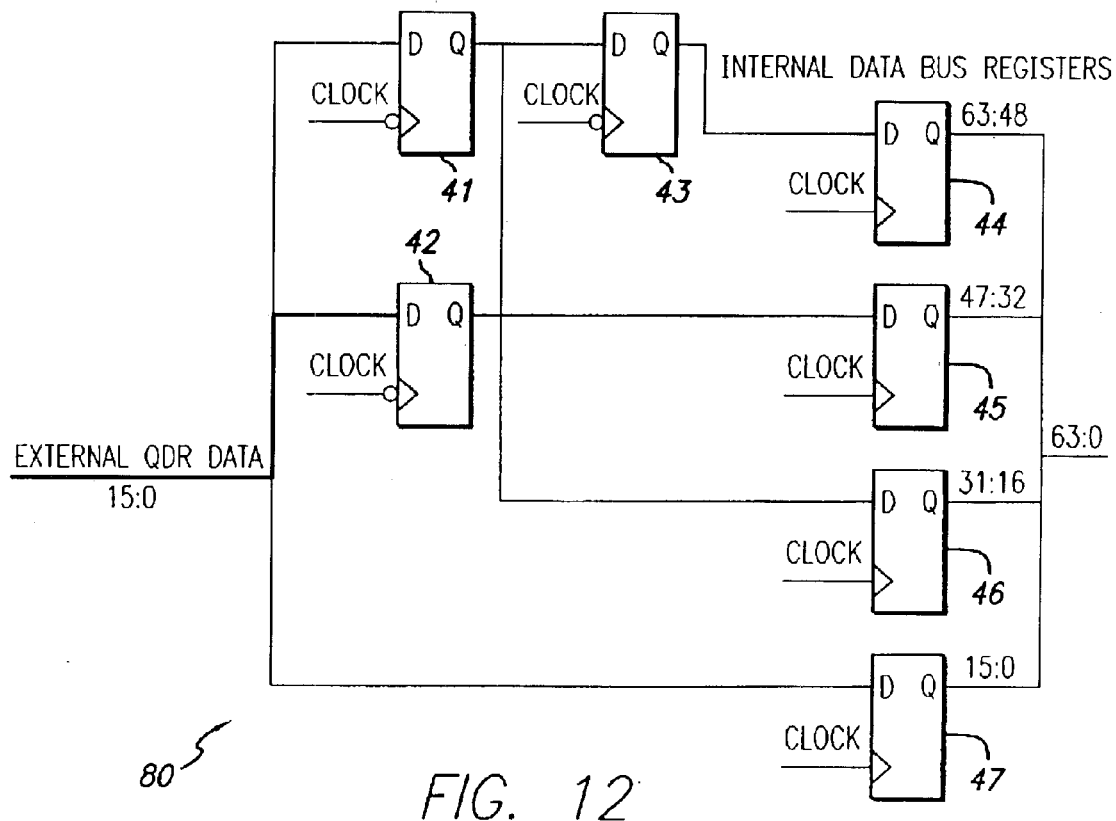
FIG. 12 is another exemplary block diagram illustrating writing data from a 16-bit memory device to a 64-bit internal data bus in accordance with a preferred embodiment of the present invention.
Figure 13:
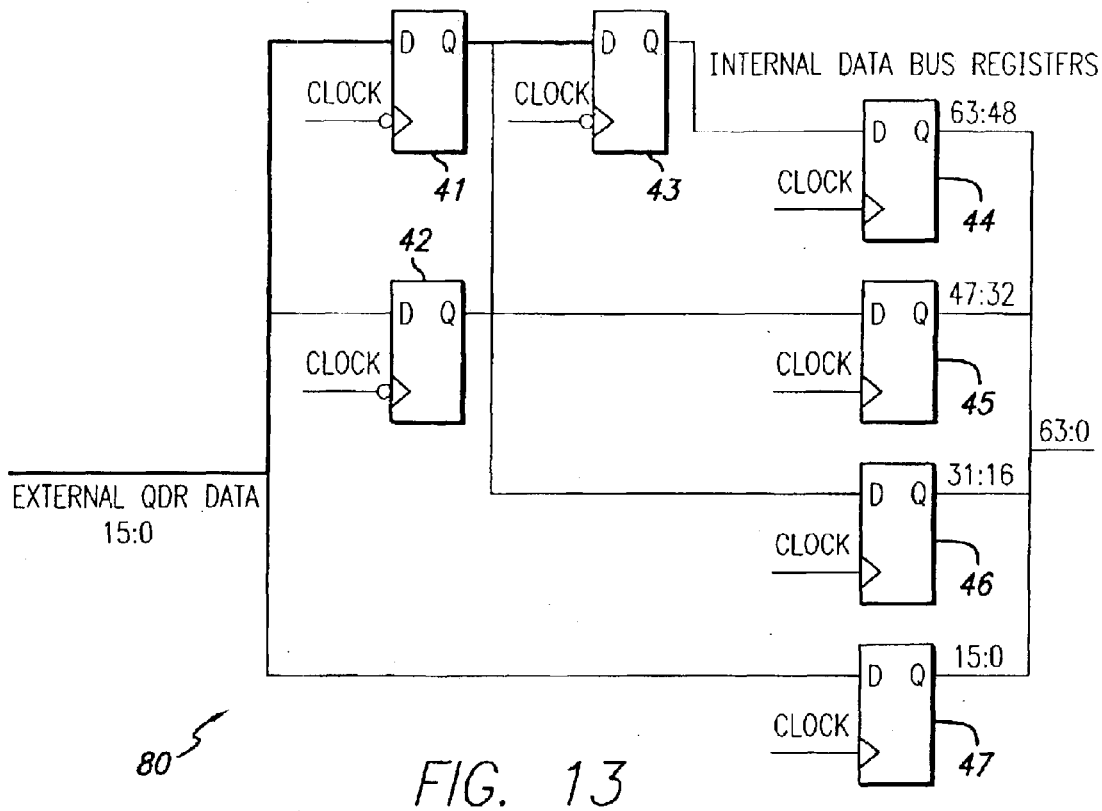
FIG. 13 is yet another exemplary block diagram illustrating writing data from a 16-bit memory device to a 64-bit internal data bus in accordance with a preferred embodiment of the present invention.
Figure 14:
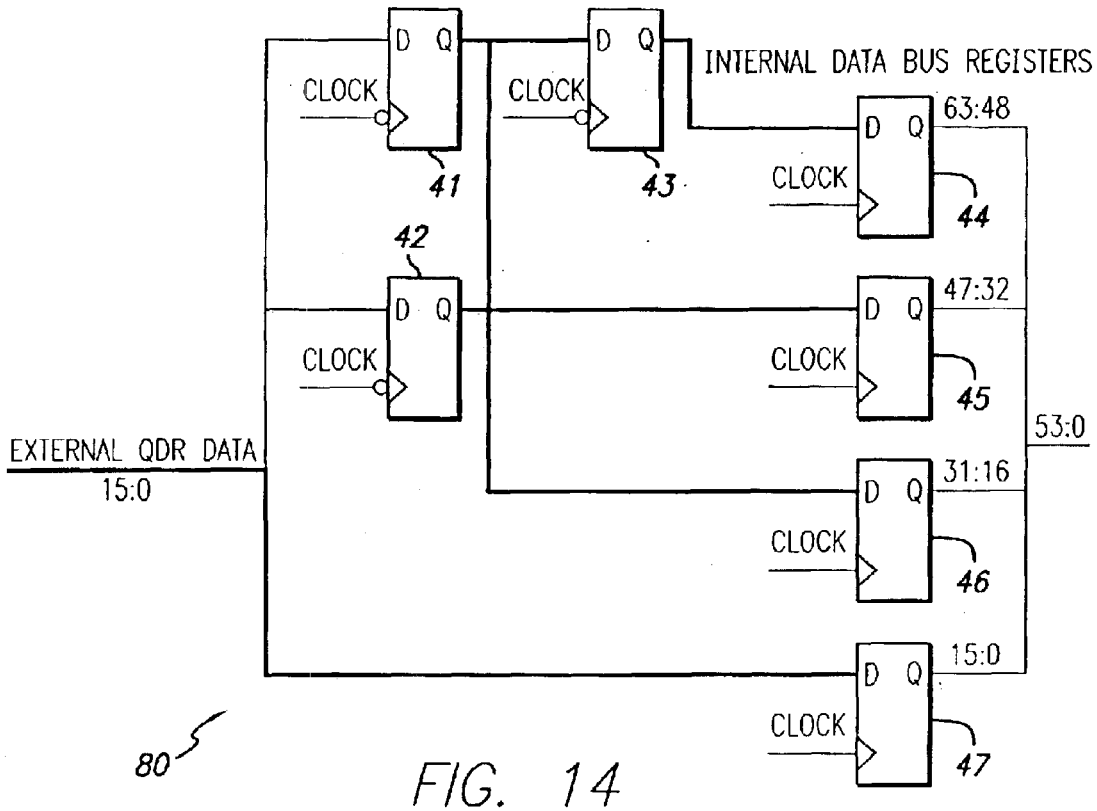
FIG. 14 is yet another exemplary block diagram illustrating writing data from a 16-bit memory device to a 64-bit internal data bus in accordance with a preferred embodiment of the present invention.

In FIG. 12, at clock=1, register 42 captures the data from the data bus of the external memory device. As with before, the flip-flops in the register save the data for use in a later clock cycle. Similarly, in FIG. 13, at clock=0 again, register 41 captures data from the external memory device again, and the data it held from the last capture is copied to register 43, which is also indicated as capturing the data by a symbolic bolded line leading to the D input. Finally, in FIG. 14, the fourth stage, all data captured in the previous three stages are copied into the internal data bus registers 44–46. In addition, the current external QDR data are captured into register 47. The data that were captured in the first stage become bits 63 to 48 of the internal data bus. The data captured in the second stage become bits 47 to 32 of the internal data bus. The third-stage data become bits 31 to 16, and finally, the external QDR data that are captured in this cycle become bits 15 to 0 of the internal data bus.

Figure 15:
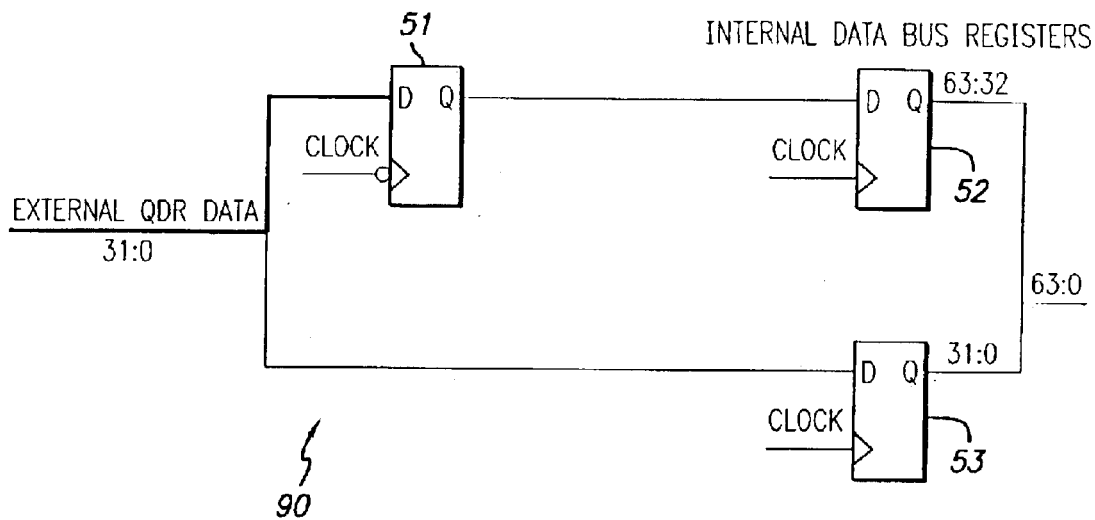
FIG. 15 is an exemplary block diagram illustrating writing data from a 32-bit memory device to a 64-bit internal data bus in accordance with a preferred embodiment of the present invention.
Figure 16:
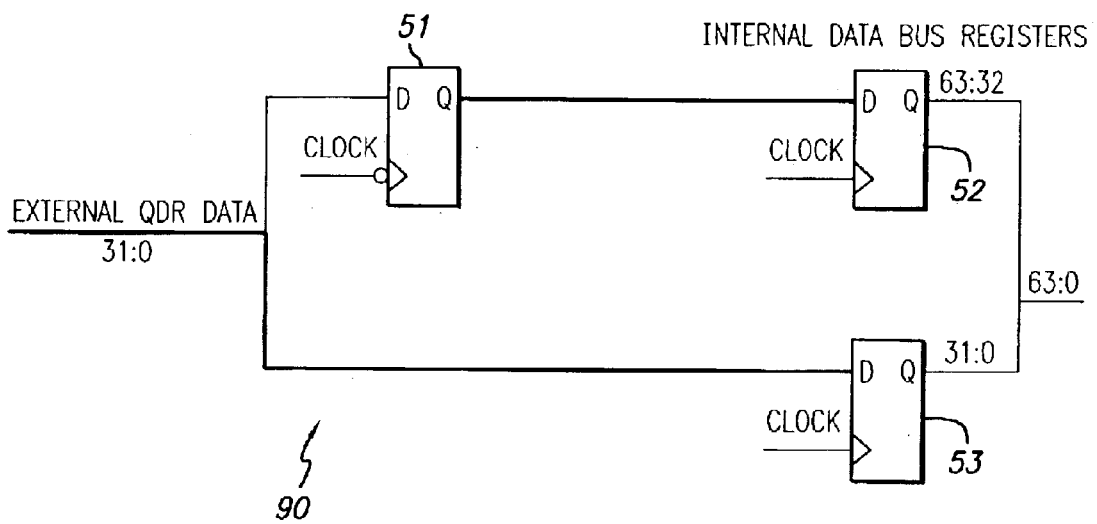
FIG. 16 is another exemplary block diagram illustrating writing data from a 32-bit memory device to a 64-bit internal data bus in accordance with a preferred embodiment of the present invention.

FIGS. 15–16 illustrate a data read section 90 of a memory interface having registers 51–53 for reading data from a 32-bit QDR memory device to a 64-bit ASIC device in accordance with another embodiment of the present application. In FIG. 15, showing the first stage of external QDR data capture, the 32-bit bus is captured on the falling edge of clock by register 51. The captured data will then be used in the next stage as shown in FIG. 16, whereby the internal data bus data is completely formed on the rising edge of clock. The 32 bits of external QDR data that were captured in the first stage by register 51 become bits 63 to 32 of the internal data bus data bits and is captured by internal data bus register 52. Bits 31 to 0 of the internal data bus bits are read directly from current external QDR data into internal data bus register 53.

In one embodiment of the present invention, the read sections shown in FIGS. 11–16 are combined with a delay configuration as shown in FIG. 1 wherein the "external QDR data" inputted can be either of QDR I or QDR II type data, whereby the two types of data are first normalized prior to being inputted into the registers. Accordingly, in such an embodiment, it is irrelevant as to whether the data source to be read is QDR-I or QDR-II type since it will have been through the delay elements and multiplexer as described earlier.

Figure 17:
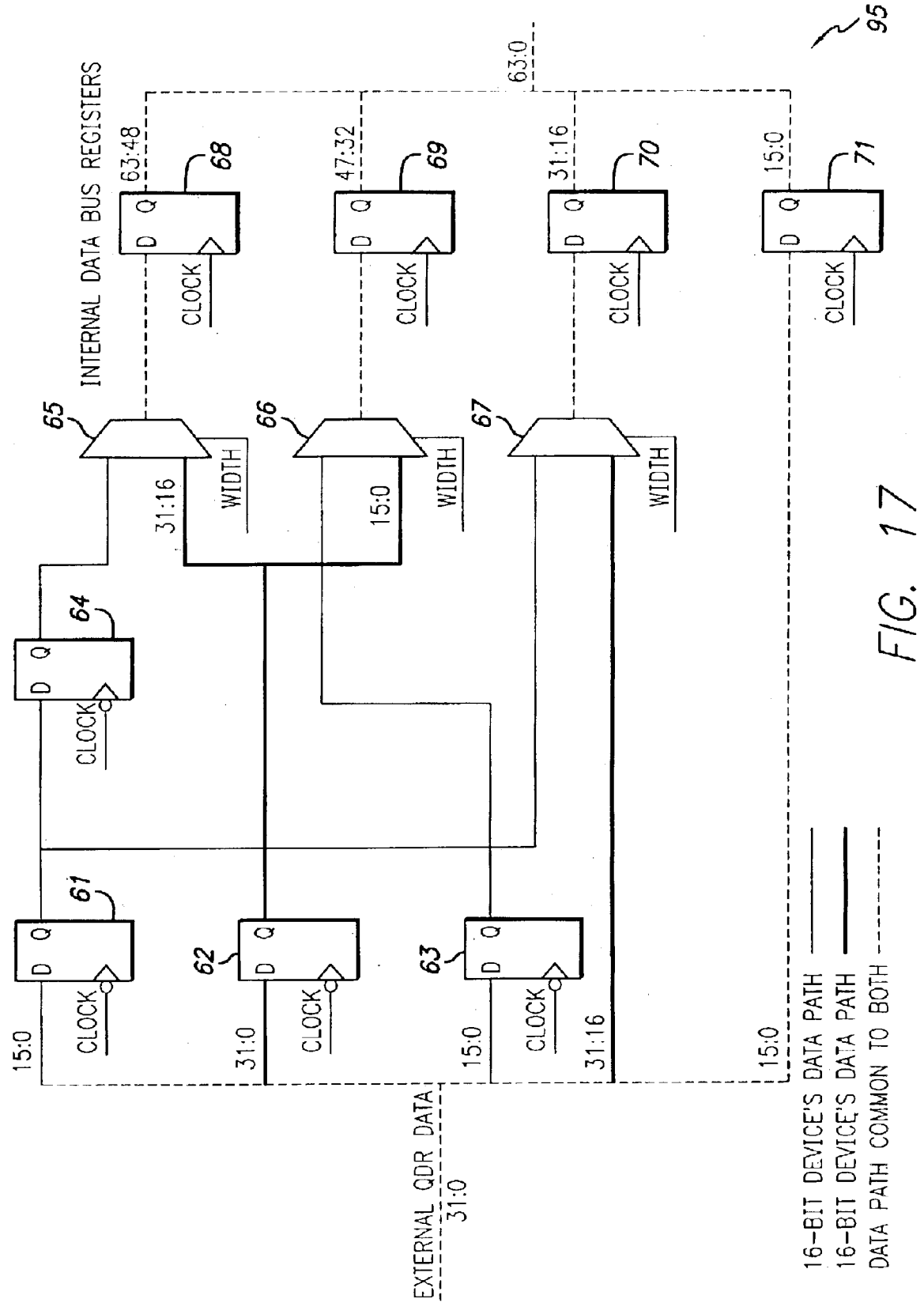
FIG. 17 is an exemplary block diagram illustrating an interface capable of writing data from either a 32-bit or 16-bit memory device to a 64-bit internal data bus of an ASIC device.

The above illustrations teach how QDR devices of different bus widths could be matched to an internal data bus of a different width, which is fixed, for data reading operations from the QDR devices. In other preferred embodiments such as the one as shown in FIG. 17, a multiplexing scheme can be employed that can switch between various configurations to support reading from different external memory devices having different bus widths. Specifically, in FIG. 17, the internal data bus registers 68–70 are connected to multiplexers 65–67 for driving the flip-flop inputs that will route data from different sources based on the state of the select pin of those multiplexers. In this case, a width selector input pin may be used for the multiplexers to signal the bus widths of the external memory device, such as designating a "32-bit QDR device" when the signal is equal to 1, and a "16-bit QDR device" when the selector signal is equal to 0. It should be understood that one skilled in the art can vary or expand the configuration of the multiplexers and registers to realize a different data read application, such as reading data from an 8-bit external memory device.

In the preferred embodiment of the present invention, the data write section 20 shown in FIGS. 7 and 8 and the data read section 95 shown in FIG. 17 are combined to form a bi-directional memory interface capable of reading and writing data between a 64-bit ASIC device and a 32-bit QDR memory device or a 16-bit QDR memory device, and whereby the delay circuit 11 shown in FIG. 1 is also combined with the read section so as to normalize and thereby support data transfer from selectable sources of QDR I or QDR II type memory devices.

It should be understood by one skilled in the art that the illustrated data write sections can be combined with the data read sections in a variety of possible combinations in order to form a complete two-way external memory interface, and that the delay element may be combined with the data read section to normalize and therefore support data from both QDR I and QDR II type memory devices.

Finally, it should be noted that the present invention may be embodied in forms other than the preferred embodiments described above without departing from the spirit or essential characteristics thereof For instance, the interface illustrated may be incorporated into the ASIC device as an interface section of the ASIC device, as opposed to a separate interface coupled to the ASIC, or be incorporated into any one computer or computer network, including a storage area network having attached storage devices. Furthermore, the embodiments of the present invention do not require specific hardware realization by may be realized via a programmed processor performing the steps that would be carried out by the hardware. The specification contained herein provides sufficient disclosure for one skilled in the art to implement the various embodiments of the present invention, including the preferred embodiment, which should be considered in all aspect as illustrative and not restrictive; all changes or alternatives that fall within the meaning and range or equivalency of the claim are intended to be embraced within.

What we claim:

1. A data interface for transferring data between a data bus of an integrated circuit and a data bus of a memory device, said integrated circuit having a data bus width greater than a data bus width of the memory device, said interface comprising:
   a data write section for sequentially transferring, from the integrated circuit data bus to the memory device data bus, a plurality of selected subsets of data outputted from the integrated circuit data bus, wherein each subset of data is outputted from the integrated circuit data bus at the same time; and
   a data read section for combining and transferring, from the memory device data bus to the integrated circuit data bus, data sequentially provided from the memory device data bus, wherein a data width transferred matches the data width of the integrated circuit data bus.

2. The data interface of claim 1, wherein the memory device is a quad data rate memory device.

3. The data interface of claim 1, further comprising a data input section for transferring data from the memory device data bus to the data write section, wherein the data input section includes a delaying section for delaying the data from the memory device data bus.

4. The data interface of claim 1,
   wherein the data write section is configurable to support data transfer from the integrated circuit data bus to any memory device having a data bus width less than the width of the integrated circuit data bus, and
   wherein the data read section is configurable to support data transfer data, to the integrated circuit data bus, from any memory device having a data bus width less than the width of the integrated circuit data bus.

5. The data interface of claim 1,
   wherein the data write section comprises a multiplexer, said multiplexer including a data input bus having a width equal to or greater than the width of the integrated circuit data bus, and a data output bus having a width less than the width of the integrated circuit data bus but equal to or greater than the width of the memory device data bus, and
   wherein the data read section comprises:
   a plurality of input registers, wherein outputs of the input registers are operatively coupled to the integrated circuit data bus; and
   a delay register, wherein an input of the delay register is operatively coupled to the memory device data bus,
   wherein an input of one of the input registers is operatively coupled to the memory device data bus, and wherein the input of another one of the input registers is operatively coupled to the memory device data bus.

6. A computer network including the data interface of claim 1, wherein at least one storage device is operatively coupled to the computer network.

7. A method for transferring data between a data bus of an integrated circuit and a data bus of a memory device, said integrated circuit having a data bus width greater than a data bus width of the memory device, said method comprising:
   sequentially transferring, from the integrated circuit data bus to the memory device data bus, a plurality of selected subsets of data outputted from the integrated circuit data bus, wherein each subset of data is outputted from the integrated circuit data bus at the same time; and
   combining and transferring, from the memory device data bus to the integrated circuit data bus, data sequentially provided from the memory device data bus, wherein a data width transferred matches the data width of the integrated circuit data bus.

8. The method of claim 7, further comprising the step of delaying the data from the memory device data bus.

9. A machine-readable medium containing a set of executable instructions for causing a processor to transfer data between a data bus of an integrated circuit and a data bus of a memory device by causing the processor to perform the steps of:
   sequentially transferring, from the integrated circuit data bus to the memory device data bus, a plurality of selected subsets of data outputted from the integrated circuit data bus, wherein each subset of data is outputted from the integrated circuit data bus at the same time; and
   combining and transferring, from the memory device data bus to the integrated circuit data bus, data sequentially provided from the memory device data bus, wherein a data width transferred matches a data width of the integrated circuit data bus.

10. A data interface for transferring data between an integrated circuit having a data bus and a memory device having a data bus, said integrated circuit having a data bus width greater than a data bus width of the memory device, said interface comprising:
   a data write section including a data write multiplexer, said data write multiplexer including a data input bus having width equal to or greater than the width of the integrated circuit data bus, and a data output bus having a width less than the width of the integrated circuit data bus but equal to or greater than the width of the memory device data bus; and
   a data read section including:
   first and second input registers, wherein outputs of the first and second input registers are operatively coupled to the integrated circuit data bus, and
   a first delay register, wherein an input of the first delay register is operatively coupled to the memory device data bus,
   wherein an input of one of said first and second input registers is operatively coupled to a data output of the first delay register, and wherein an input of another one of the first and second input registers is operatively coupled to the memory device data bus.

11. The data interface of claim 10, wherein the memory device is a quad data rate memory device.

12. The data interface of claim 10, further comprising a data delay element operatively coupled to the memory device data bus.

13. The data interface of claim 10, wherein the memory device can be any memory device having a data bus width less than the width of the integrated circuit data bus, wherein the data write multiplexer includes a control input for designating the width of the memory device, and wherein the data read section further comprises:
   a shift register, wherein an input of the shift register is operatively coupled to the memory device data bus, and wherein an input of a third input register is operatively coupled to a shift register output;
   a second delay register comprised of first and second cascade registers, wherein an input of the second delay register is operatively coupled to the memory device data bus;

first, second and third multiplexers, wherein an output of each multiplexer is operatively coupled to the input of a different input register, wherein an input of the first multiplexer is operatively coupled to outputs of the shift register and the second delay register, wherein an input of the second multiplexer is operatively coupled to outputs of the first delay register and the second delay register, and wherein an input of the third multiplexer is operatively coupled to outputs of the first cascade register and the memory device data bus.

14. The data interface of claim 13, wherein an output of the first multiplexer is operatively coupled to the input of the third input register, an output of the second multiplexer is operatively coupled to one of said first and second input registers, and an output of the third multiplexer is operatively coupled to a fourth input register.

15. The data interface of claim 13, wherein each of the first, second and third multiplexers includes a control input for designating the width of the memory device data bus width and controlling the outputs of the first, second and third multiplexers.

16. The data interface of claim 10, further comprising a data input selector for selecting data from a first and a second data path, wherein said first and second data paths transfer data at different timings, said data input selector comprising:

a data select multiplexer having a first and a second data input, a data output, and a data selector input, wherein one of said first and second data inputs of the data select multiplexer is operatively coupled to the memory device data bus, and wherein the data output of the data select multiplexer is operatively coupled to the data read section such that the data read section is operatively coupled to the memory device data bus via the data select multiplexer; and a delay element having a data input and a data output, wherein the data output of said delay element is operatively coupled to the first data input of said data select multiplexer, wherein the data input of the delay element is operatively coupled to one of the first and second data paths, and wherein the second data input of said data select multiplexer is directly coupled to the other one of the first and second data paths.

17. A computer network including the data interface of claim 10, wherein at least one storage device is operatively coupled to the computer network.

18. A data input processor for selecting data from a first and a second data output device, wherein said first and second data output devices output data at different timings, said data input processor comprising:

a multiplexer having a first data input, a second data input, a data output, and a data selector input; and a delay element having a data input and a data output, wherein the data output of said delay element is operatively coupled to the first data input of said multiplexer, and wherein the data input of the delay element is operatively coupled to a data output of the first data output device, wherein a data output of the second data output device is operatively coupled to the second data input of said multiplexer.

19. The data input processor of claim 18, wherein the data selector input of the multiplexer is operable to select one of a delayed first data input of said multiplexer and the second data input of said multiplexer to be outputted from the multiplexer.

20. The data input processor of claim 18, wherein a time delay characteristic of the delay element is predetermined in accordance with a data output timing difference between the first and second data output device.

21. The data input processor of claim 18, wherein said first data output device is a QDR I type memory device, and said second data output device is a QDR II type memory device.

22. An integrated circuit including the data processor of claim 18, wherein the integrated circuit is operatively coupled to one of the first and second data output devices.

23. A computer network including the data processor of claim 18, wherein the computer network includes at least one integrated circuit and at least one memory device.

24. A data input selector for selecting data from a first and a second memory device, wherein said first and second memory devices emit data at different timings, said data input selector comprising:

means for delaying the data outputted from the first memory device; and means for selecting one of the delayed data outputted from the first memory device and the data outputted from the second memory device.

25. The data input selector of claim 24, wherein the first memory device is a QDR type I memory device, and the second memory device is a QDR type II memory device.

26. An integrated circuit including the data input selector of claim 24, wherein the integrated circuit is operatively coupled to one of the first and second memory devices.

27. A computer network including the data input selector of claim 24, wherein the computer network includes at least one integrated circuit and at least one memory device.

28. An integrated circuit having a memory data interface for transferring data between a data bus of an integrated circuit and data bus of a memory device, said integrated circuit having a data bus width greater than a data bus width of the memory device, said integrated circuit comprising:

a data write section for sequentially transferring, from the integrated circuit data bus to the memory device data bus, a plurality of selected subsets of data outputted from the integrated circuit data bus, wherein each subset of data is outputted from the integrated circuit data bus at the same time; and a data read section for combining and transferring, from the memory device data bus to the integrated circuit data bus, data sequentially provided from the memory device data bus, wherein a data width transferred matches the data width of the integrated circuit data bus.

29. A computer network including the integrated circuit of claim 28, wherein the computer network includes at least one memory device operatively coupled to the integrated circuit.

30. A first integrated circuit having a memory data interface for transferring data between a second integrated circuit having a data bus and a memory device having a data bus, said second integrated circuit having a data bus width greater than a data bus width of the memory device, said first integrated circuit comprising:

a data write section including a data write multiplexer, said data write multiplexer including a data input bus having a width equal to or greater than the width of the second integrated circuit data bus, and a data output bus having a width less than the width of the second integrated circuit data bus but equal to or greater than the width of the memory device data bus; and a data read section including:
   first and second input registers, wherein outputs of the first and second input registers are operatively coupled to the second integrated circuit data bus, and
   a first delay register, wherein an input of the first delay register is operatively coupled to the memory device data bus,
   wherein an input of one of said first and second input registers is operatively coupled to a data output of the first delay register, and wherein an input of another one of the first and second input registers is operatively coupled to the memory device data bus.

31. A computer network including the first integrated circuit of claim 30, wherein the computer network includes at least one memory device operatively coupled to the first integrated circuit.

32. An integrated circuit having a data select section for selecting data from a first and a second data output device, wherein said first and second data output devices output data at different timings, said integrated circuit comprising:
   a multiplexer having a first data input, a second data input, a data output, and a data selector input; and
   a delay element having a data input and a data output, wherein the data output of said delay element is operatively coupled to the first data input of said multiplexer, and wherein the data input of the delay element is operatively coupled to a data output of the first data output device,
   wherein a data output of the second data output device is operatively coupled to the second data input of said multiplexer.

* * * * *